(12) United States Patent
Rohmer

(10) Patent No.: US 6,508,445 B1
(45) Date of Patent: Jan. 21, 2003

(54) GANGABLE LOW VOLTAGE BRACKET FOR ELECTRICAL DEVICES

(75) Inventor: Richard Rohmer, Jordan, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 09/882,468

(22) Filed: Jun. 14, 2001

(51) Int. Cl.[7] .............................................. F16M 11/00
(52) U.S. Cl. ........................ 248/200; 220/4.02; 174/58; 248/906
(58) Field of Search ................................ 248/200, 906; 174/50, 58, 63; 220/4.02, 4.03

(56) References Cited

U.S. PATENT DOCUMENTS

| | | | | |
|---|---|---|---|---|
| 1,066,215 A | * | 7/1913 | Murray ....................... | 220/3.94 |
| 1,167,746 A | * | 1/1916 | Funsten ....................... | 52/574 |
| 1,167,879 A | * | 1/1916 | Bayliss ....................... | 220/3.94 |
| 1,201,003 A | * | 10/1916 | Van Duzer .................. | 220/3.92 |
| 1,205,589 A | * | 11/1916 | Young ....................... | 220/3.92 |
| 1,230,218 A | * | 6/1917 | Raquette .................... | 220/3.94 |
| 1,456,385 A | * | 5/1923 | Kvarnstrom ................ | 220/3.92 |
| 1,483,453 A | * | 2/1924 | Knoderer ................... | 217/12 R |
| 1,531,309 A | * | 3/1925 | Ryden ....................... | 220/3.94 |
| 1,534,723 A | * | 4/1925 | Lewis ....................... | 220/3.94 |
| 3,998,022 A | * | 12/1976 | Muse ........................... | 52/574 |
| 4,134,241 A | * | 1/1979 | Walton ........................ | 52/275 |
| 5,221,814 A | * | 6/1993 | Colbaugh et al. ............. | 174/58 |
| 5,703,327 A | * | 12/1997 | Jorgensen ................... | 174/53 |
| 6,229,087 B1 | * | 5/2001 | Archer ........................ | 174/50 |
| 6,300,567 B1 | * | 10/2001 | Hayduke et al. .............. | 174/58 |
| 6,346,674 B1 | * | 2/2002 | Gretz .......................... | 174/58 |
| 6,414,241 B1 | * | 6/2002 | O'Donnell ................... | 174/57 |

* cited by examiner

Primary Examiner—Leslie A. Braun
Assistant Examiner—A. Joseph Wujciak, III
(74) Attorney, Agent, or Firm—Wall Marjama & Bilinski LLP

(57) ABSTRACT

One low voltage old work bracket can be ganged into a two-gang, three-gang, four-gang, etc. bracket with no modifications to the single bracket unit. The side walls are staggered so that the first side wall from the second bracket fits over the second side wall from the first bracket. Corresponding tongues and grooves hold the ganged brackets together. Each bracket preferably includes a wire retention tab and a pair of swing arms on opposing corners of the bracket frame.

8 Claims, 3 Drawing Sheets

GANGABLE LOW VOLTAGE BRACKET FOR ELECTRICAL DEVICES

FIELD OF THE INVENTION

This invention relates generally to the field of low voltage brackets, and more particularly to a gangable low voltage bracket.

BACKGROUND OF THE INVENTION

Low voltage brackets retain low voltage electrical devices in a wall, floor, or ceiling. The NEC defines "low voltage" as an electromotive force rated 24 volts, nominal, or less, supplied from a transformer, converter, or battery. Low voltage brackets are thus used with telephones, facsimile machines, modems, coax cable, computer lines, multimedia, video, speaker, fiber-optic cable, etc.

Electrical contractors who install these brackets are looking for an economical way to mount low voltage devices in an existing structure quickly. Although a standard old work box could be used, some data-com wires do not work well with the wire entry points in these standard boxes. An example is coax cable or fiber-optic cable which have a minimum bend radius that are hard to manage through the cable entry points in a standard box. Since low voltage devices do not require a sealed box as higher voltages do, one solution is to cut the back off of a standard box to permit the minimum bend radius. Although this works, it is very time consuming for the electrician.

Examples of known low voltage brackets are:
a) Carlon, catalog number B100RB;
b) Arlington, catalog number LV1 (single gang) and LV2 (double gang); and
c) Caddy, catalog numbers MP1P (single gang), MPAL2 (double gang) and MP34P (3 or 4 gang).

Carlon makes only a one-gang (or single-gang) bracket, while Arlington offers single, two, and four-gang brackets, with the four-gang bracket modifiable into a three-gang bracket. Caddy offers a single-gang and a two-gang bracket. Although these devices work, the electrician installing these devices is required to keep all different sizes in stock, or be prepared to special order them as necessary to meet differing requirements.

The typical installation steps for installing these brackets are:
1) Cut a square hole in the mounting surface (usually sheet-rock or paneling);
2) Fish and pull the cable or wires through this hole;
3) Route the cables or wires through the bracket;
4) Install the bracket into the square hole cut;
5) Tighten swing arm screws to secure device to the wall making sure the wires do not fall back into the wall;
6) Attach the cables or wires to the low voltage device or plate; and
7) Attach a wall plate if one is not integral to the device.

None of the above listed devices have a provision to retain the cable or wires until they are attached to the low voltage device.

SUMMARY OF THE INVENTION

Briefly stated, one low voltage old work bracket can be ganged into a two-gang, three-gang, four-gang, etc. bracket with no modifications to the single bracket unit. The side walls are staggered so that the first side wall from the second bracket fits over the second side wall from the first bracket. Corresponding tongues and grooves hold the ganged brackets together. Each bracket preferably includes a wire retention tab and a pair of swing arms on opposing corners of the bracket frame.

According to an embodiment of the invention, a low voltage bracket includes a frame having first and second side walls and first and second end walls, with the first and second side walls being substantially parallel to each other and substantially perpendicular to the first and second end walls; and a bottom of the first side wall being in a same plane as a top of the second side wall, with the plane being substantially orthogonal to the first and second side walls and the first and second end walls.

DETAILED DESCRIPTION OF THE PREFERRED EMBODIMENT

Figure 1:
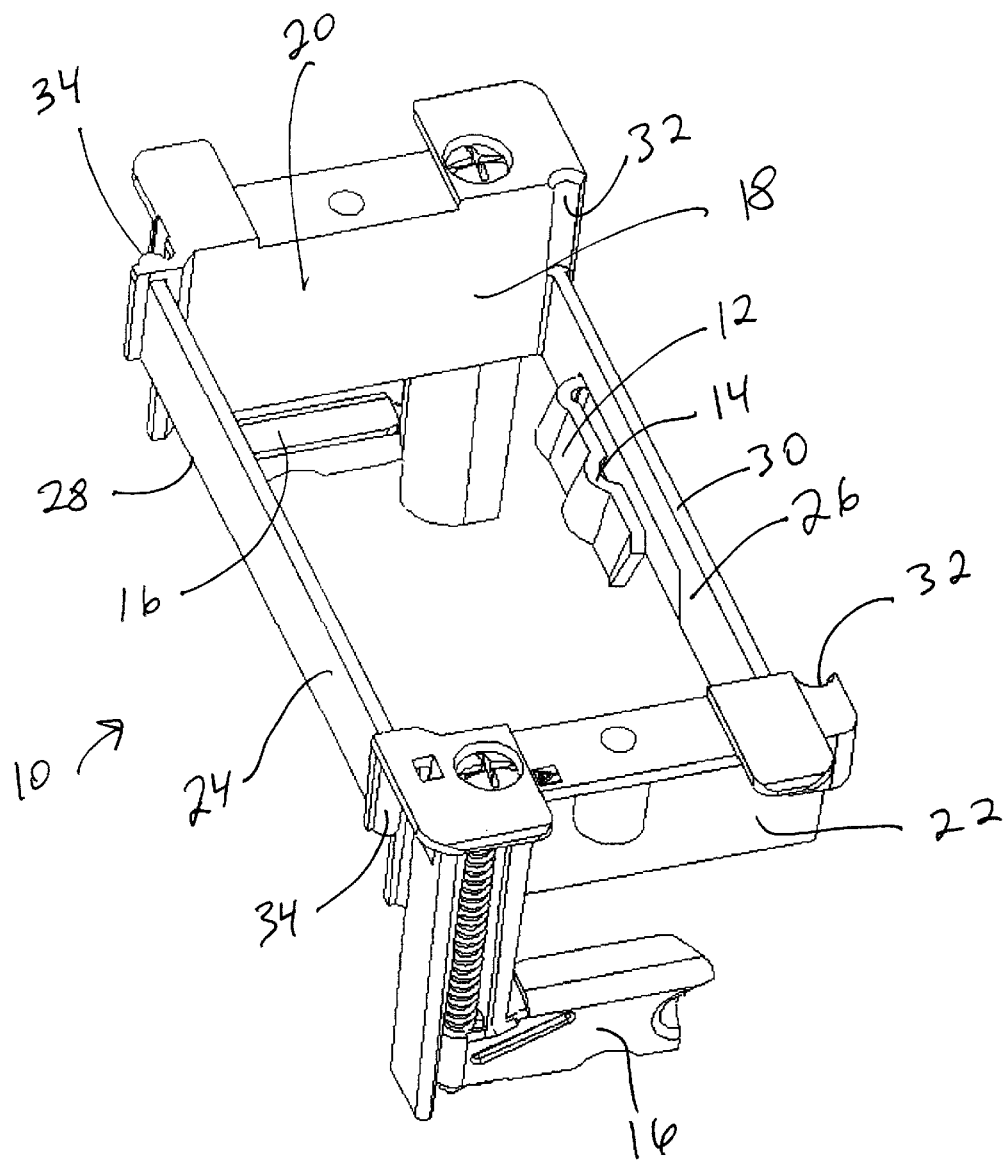
FIG. 1 shows a perspective view of a low voltage old work bracket according to an embodiment of the invention.

Referring to FIG. 1, a low voltage old work bracket 10 includes an integral wire retention tab 12. Tab 12 holds wires (not shown) in place until a device (not shown) is wired. Tab 12 includes at least one contoured portion 14 to accommodate different size wires and cables. Conventional swing arms 16 are on opposing corners of a frame 18 of bracket 10. Frame 18 includes end walls 20, 22 as well as first and second side walls 24, 26. Bracket 10 is preferably made of plastic.

First side wall 24 extends between upper side portions of end walls 20, 22, while second side wall 26 extends between lower side portions of end walls 20, 22. A bottom edge 28 of first side wall 24 is approximately level with a top edge 30 of second side wall 26. Thus, first and second side walls 24, 26 are staggered. A groove 32 is in each end wall 20, 22 above the location where second side wall 26 joins end walls 20, 22. A corresponding tongue 34 is in each end wall 20, 22 at the location where first side wall 24 joins end walls 20, 22.

Figure 2A:
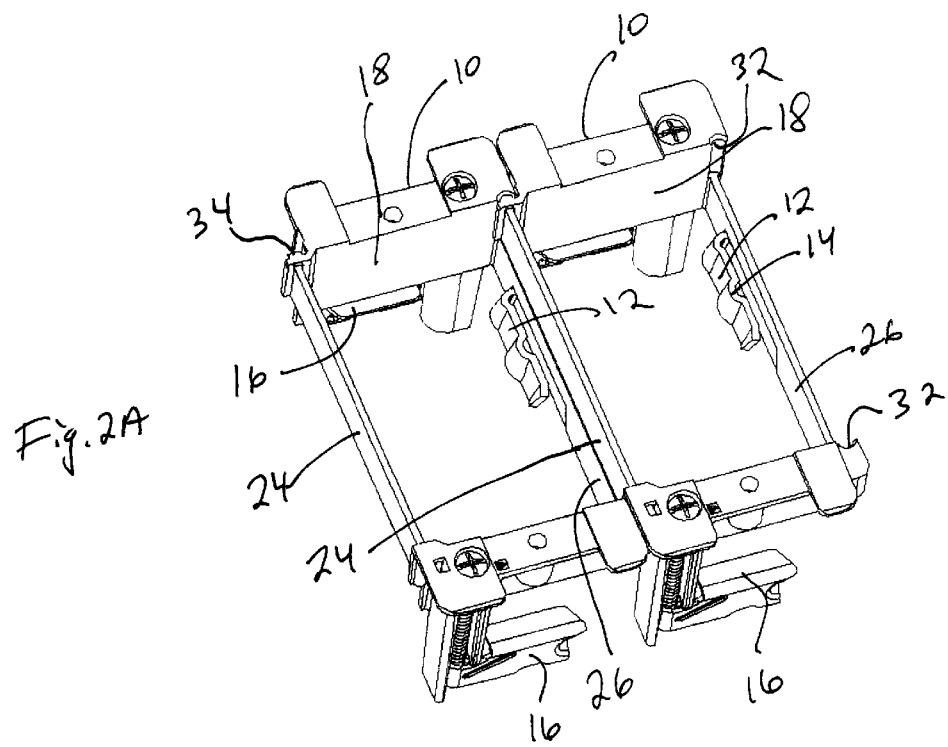
FIG. 2A shows a perspective view of two low voltage brackets according to an embodiment of the invention that are ganged together.
Figure 2B:
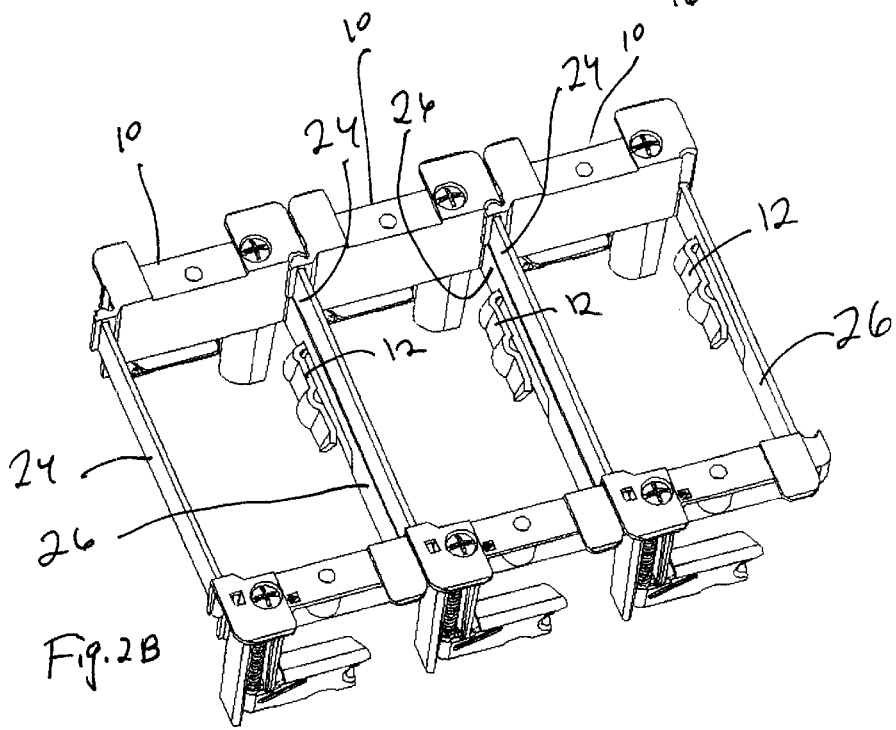
FIG. 2B shows a perspective view of three low voltage brackets according to an embodiment of the invention that are ganged together.

Referring to FIGS. 2A–2B, a plurality of brackets 10 are ganged together by sliding tongues 34 into grooves 32 until bottom edge 28 of first side wall 24 abuts top edge 30 of second side wall 26. FIG. 2A shows a two-gang setup, while FIG. 2B shows a three-gang setup. There is no limit to the number of gangs possible with bracket 10.

Figure 3A:
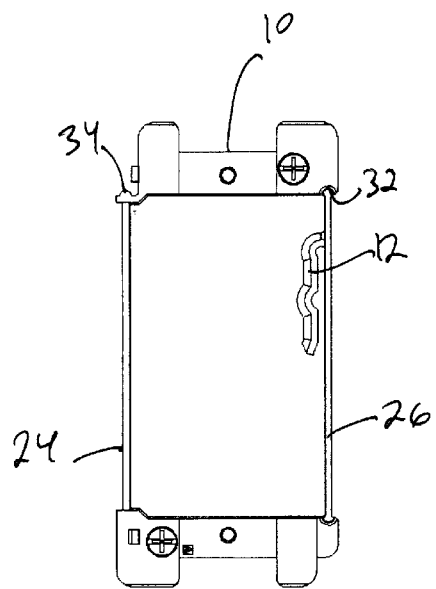
FIG. 3A shows a top view of the low voltage bracket of the embodiment of FIG. 1.
Figure 3B:
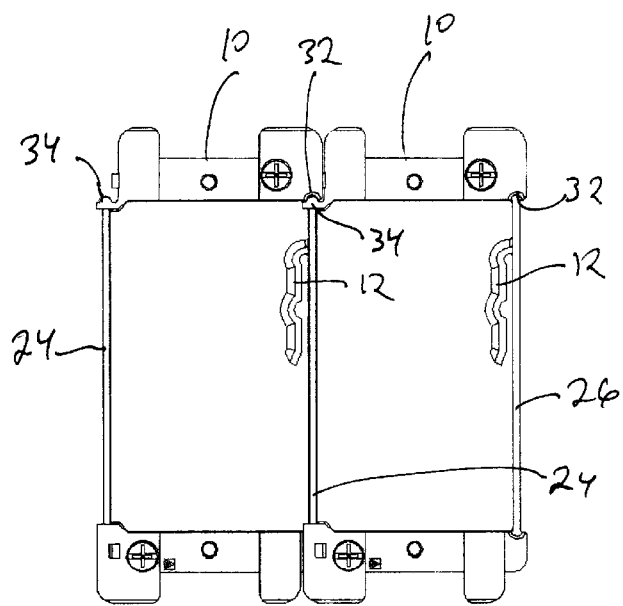
FIG. 3B shows a top view of the two low voltage brackets of the embodiment of FIG. 2A that are ganged together.
Figure 3C:
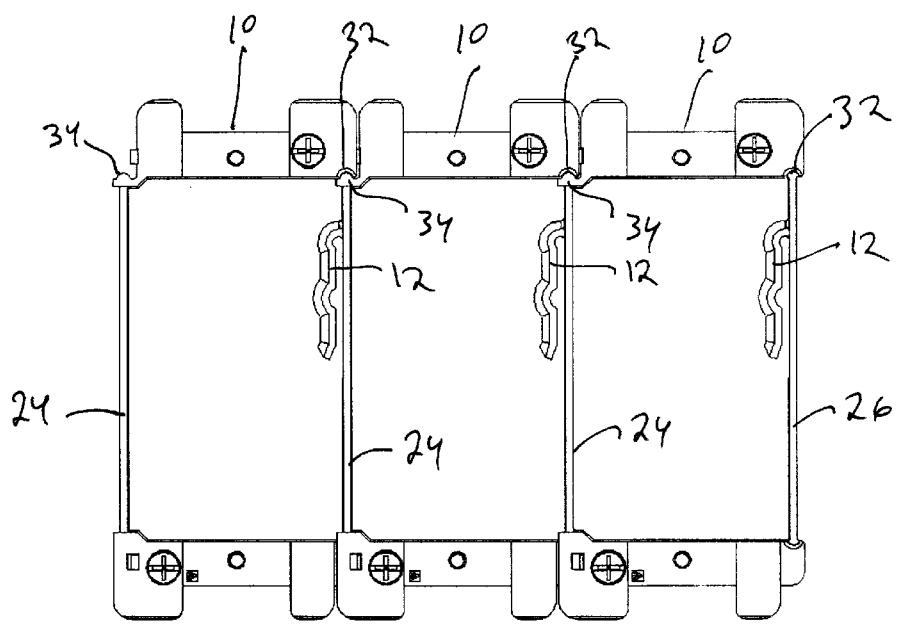
FIG. 3C shows a top view of the three low voltage brackets of the embodiment of FIG. 2B that are ganged together.

Referring to FIGS. 3A–3C, a top plan view of single-gang, two-gang, and three-gang setups of bracket 10 show the interconnection of tongues 34 into grooves 32.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A low voltage bracket, comprising:

a frame having first and second side walls and first and second end walls, said first and second side walls being substantially parallel to each other and substantially perpendicular to said first and second end walls; and a bottom of said first side wall being in a same plane as a top of said second side wall, said plane being substantially orthogonal to said first and second side walls and said first and second end walls.

2. A bracket according to claim 1, further comprising means, on said frame, for ganging two or more of said brackets together.

3. A bracket according to claim 1, further comprising:

a tongue on each end of said first side wall; and a corresponding groove in each end wall directly above a location where said second side wall meets each end wall, wherein, when first and second ones of said brackets are ganged together, said tongues fit into said corresponding grooves.

4. A bracket according to claim 3, further comprising a wire retention tab on an interior face of at least one of said first and second side walls.

5. A bracket according to claim 4, further comprising a pair of swing arms attached to said frame at opposite corners of said frame.

6. A bracket according to claim 4, wherein said bracket is one-piece and formed of plastic.

7. A bracket according to claim 1, further comprising a wire retention tab on an interior face of at least one of said first and second side walls.

8. A bracket according to claim 1, further comprising a pair of swing arms attached to said frame at opposite corners of said frame.

* * * * *